United States Patent [19]
Thompson et al.

[11] Patent Number: 6,105,592
[45] Date of Patent: Aug. 22, 2000

[54] GAS INTAKE ASSEMBLY FOR A WAFER PROCESSING SYSTEM

[75] Inventors: Raymon F. Thompson, Kalispell, Mont.; Aleksander Owczarz, Fremont, Calif.; Daniel P. Bexten, Kalispell, Mont.

[73] Assignee: Semitool, Inc., Kalispell, Mont.

[21] Appl. No.: 08/897,913

[22] Filed: Jul. 21, 1997

[51] Int. Cl.$^7$ .................................................. B08B 15/02
[52] U.S. Cl. ..................... 134/99.2; 134/105; 134/110; 134/200; 134/902
[58] Field of Search ................................ 134/94.1, 95.1, 134/99.2, 102.1, 103.2, 105, 110, 147, 148, 153, 200, 902

[56] References Cited

U.S. PATENT DOCUMENTS

| | | | |
|---|---|---|---|
| 4,300,581 | 11/1981 | Thompson | 134/902 |
| 4,682,614 | 7/1987 | Silvernail et al. | 134/155 |
| 4,816,081 | 3/1989 | Mehta et al. | 134/902 |
| 4,977,688 | 12/1990 | Roberson, Jr. et al. | 134/902 |
| 5,000,208 | 3/1991 | Ludwig et al. | 134/902 |
| 5,022,419 | 6/1991 | Thompson et al. | 134/902 |
| 5,069,236 | 12/1991 | Rierson | 134/902 |
| 5,095,927 | 3/1992 | Thompson et al. | 134/902 |
| 5,107,880 | 4/1992 | Pierson | 134/902 |
| 5,221,360 | 6/1993 | Thompson et al. | 134/902 |
| 5,706,843 | 1/1998 | Matsuo | 134/902 |

FOREIGN PATENT DOCUMENTS

| | | | |
|---|---|---|---|
| 1-270933 | 10/1989 | Japan | 134/902 |
| 5-82496 | 4/1993 | Japan | 134/902 |
| 2126710 | 3/1984 | United Kingdom | 134/902 |

*Primary Examiner*—Frankie L. Stinson
*Attorney, Agent, or Firm*—Rockey, Milnamow & Katz Ltd.

[57] ABSTRACT

An apparatus for processing a semiconductor wafer is set forth. The apparatus comprises a processing bowl that defines a processing chamber. The bowl has an opening through which wafers may be placed in the apparatus. A wafer support structure adapted to support at least one wafer is mounted for rotation within the processing chamber. A motor drive assembly is connected to rotate the wafer support structure. At least one fluid nozzle accepts processing fluid and sprays the processing fluid on the one or more wafers carried by the wafer support structure. A door is used to seal the opening of the processing bowl. The door has an opening that is open to ambient atmosphere to facilitate passage of ambient gas into the processing chamber. An ambient gas intake assembly is disposed in the door. The ambient gas intake assembly comprises a high efficiency filter, preferably, and ULPA filter, disposed to filter ambient gas passing from the opening of the door to the processing chamber and a heater disposed to heat the filtered gas prior to entering the processing chamber.

28 Claims, 5 Drawing Sheets

GAS INTAKE ASSEMBLY FOR A WAFER PROCESSING SYSTEM

CROSS-REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

This invention relates to an apparatus for processing semiconductor wafers or glass photomask plates, and more particularly, to a gas intake assembly for a semiconductor wafer processing system.

In the production of integrated circuits, the semiconductor wafers or substrates from which the integrated circuit chips are cut are processed through multiple steps. The basic material for the substrates on the wafers may be silicon, glass, or ceramic materials of various sorts or other similar materials of very thin wafer-like configuration. This basic substrate is subjected to coating, etching, and cleaning processes and it is extremely important that each processing step is performed with the greatest possible yield allowing a decrease in production costs.

Semiconductor wafers and glass photomask plates have been processed by spinning them about a vertical axis where the wafers or masks are stacked vertically as described in U.S. Pat. No. 3,760,822 with various holding mechanisms such as vacuum chucks. This has led to further disadvantages where the wafer may be only processed on one side at a time without a significantly different processing rate, wherein the topside processes at a much faster rate than that of the underside.

Other processing devices such as described in U.S. Pat. No. 3,970,471, process each wafer individually. Although the wafer is rotated about a horizontal axis, such a device only can process a single wafer at each station and is expensive and time consuming.

To eliminate many of the problems noted above, the assignee of the present invention developed a wafer processing system and set forth and claimed the system in U.S. Pat. No. 4,300,581, titled "Centrifugal Wafer Processor", issued Nov. 17, 1981. The invention set forth therein permits the processing of a plurality of wafers at the same time in a carrier. In accordance with that invention, semiconductor wafers or glass photomask plates are processed by inserting them into the carrier and placing the carrier in a rotor that rotates about a substantially horizontal axis. Various fluids may be applied to the wafers uniformly through spray nozzles while the wafers are being rotated. The spray nozzles are located above and to the side of the carrier permitting the processing to be done at low pressures. After the wafers have been treated with the processing fluid(s), heated nitrogen is provided through one or more nozzles to assist in drying the wafers as the rotor spins them in the carrier.

The present inventors have recognized that heated nitrogen is not the only gas suitable for the drying process. Rather, in certain semiconductor manufacturing processes, ambient gas may be used in the drying process. The present inventors have set forth a unique and economical system for providing such ambient gas in the drying process.

BRIEF SUMMARY OF THE INVENTION

An apparatus for processing a semiconductor wafer is set forth. The apparatus comprises a processing bowl that defines a processing chamber. The bowl has an opening through which wafers may be placed in the apparatus. A wafer support structure adapted to support at least one wafer is mounted for rotation within the processing chamber. A motor drive assembly is connected to rotate the wafer support structure. At least one fluid nozzle accepts processing fluid and sprays the processing fluid on the one or more wafers carried by the wafer support structure. A door is used to seal the opening of the processing bowl. The door has an opening that is open to ambient atmosphere to facilitate passage of ambient gas into the processing chamber. An ambient gas intake assembly is disposed in the door. The ambient gas intake assembly comprises a high efficiency filter, preferably, an ULPA filter, disposed to filter ambient gas passing from the opening of the door to the processing chamber and, optionally, a heater disposed to heat the filtered gas prior to entering the processing chamber.

DETAILED DESCRIPTION OF THE INVENTION

Figure 1:
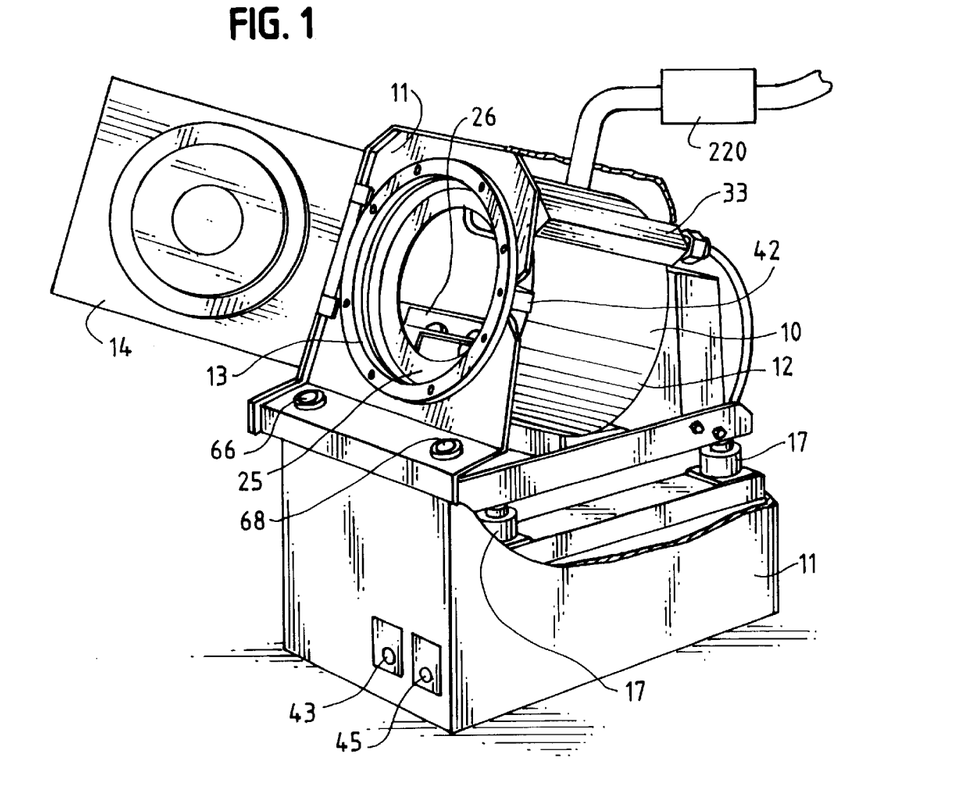
FIG. 1 is a perspective view of a wafer processing apparatus in which the gas intake arrangement of the present invention may be used.

Referring now to the drawings, an exemplary apparatus 10 for processing wafers or semiconductor components is illustrated in FIG. 1. This apparatus is merely one type of semiconductor processing apparatus in which the gas intake arrangement of the present invention may be used. Another similar processing apparatus that may employ the gas intake arrangement of the present invention is set forth in U.S. Pat. No. 5,022,419, titled "Rinser Dryer System", issued Jun. 11, 1991, and assigned to the assignee of the present invention. The teachings of both the '581 and '419 patent are incorporated by reference.

The exemplary apparatus 10, as shown in FIG. 1, has a somewhat rectangular outer configuration and a front opening. This style of apparatus is sometimes referred to as a front-loading processor, indicative of the manner in which semiconductor wafers are placed into the apparatus. The apparatus 10 includes a frame and cabinet assembly, shown generally at 11, which houses a stationary bowl 12 with a front opening 13. A hinged door 14 is arranged to seal with respect to the front opening 13 so that the bowl and door provide an enclosed processing chamber. Although the opening 13 of the illustrated embodiment is circular, other shapes may be used. Bowl 12 is preferably constructed of corrosion and solvent resistant material such as stainless steel, and is cylindrically shaped with a drain at the bottom for removal of processing fluids during the processing cycles.

A carrier rotor 15 is concentrically arranged within bowl 12 The carrier rotor includes support members 26, support rod 28, and support ring 25. Carrier rotor 15 is supported within bowl 12 for rotation about a rotation axis 29 in a known manner.

Figure 3:
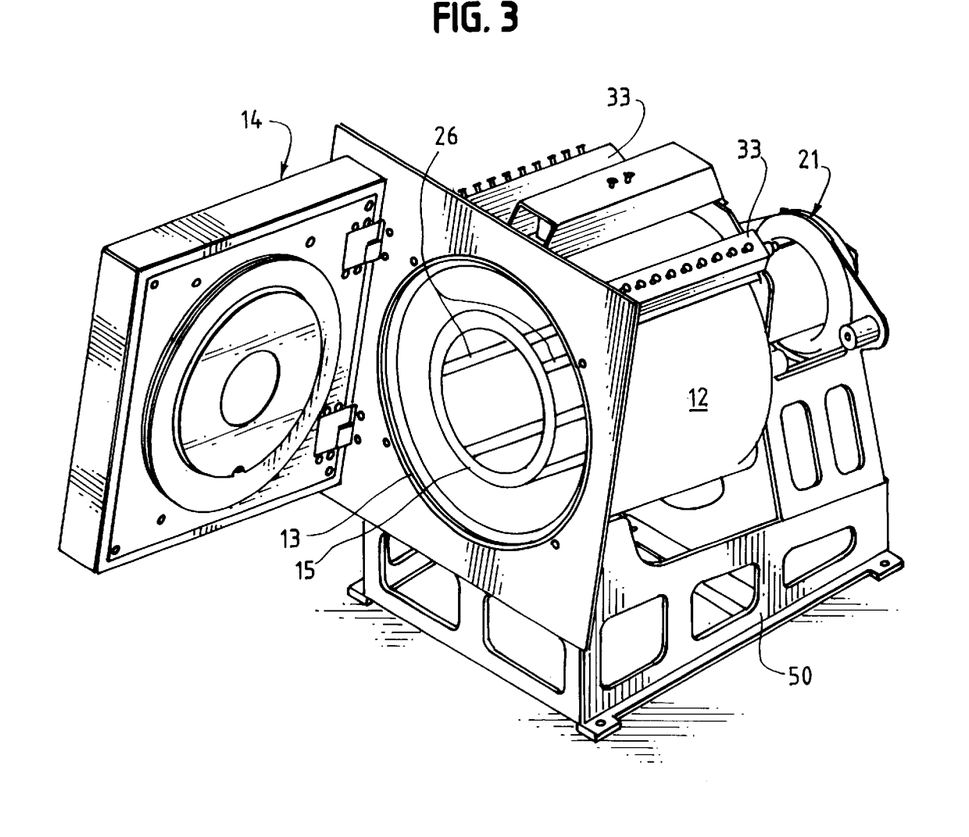
FIG. 3 is a perspective view of selected components of the apparatus of FIG. 1.
Figure 4:
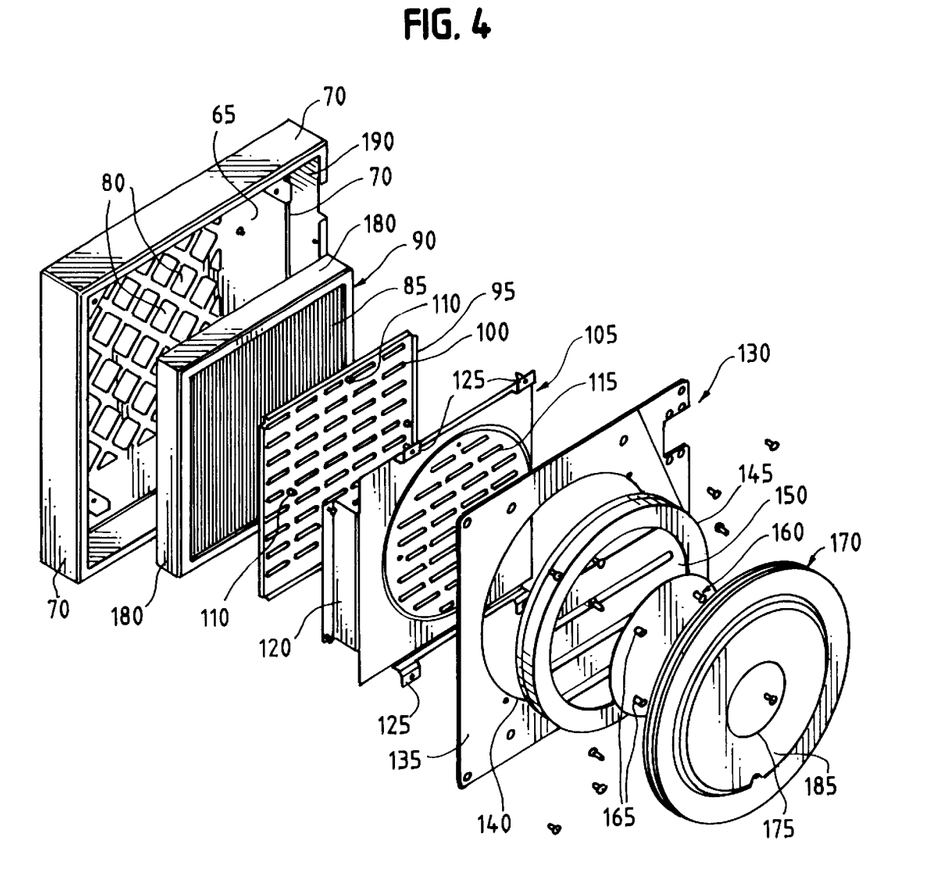
FIG. 4 is an exploded view of one embodiment of a door having a gas intake arrangement.
Figures 5, 6:
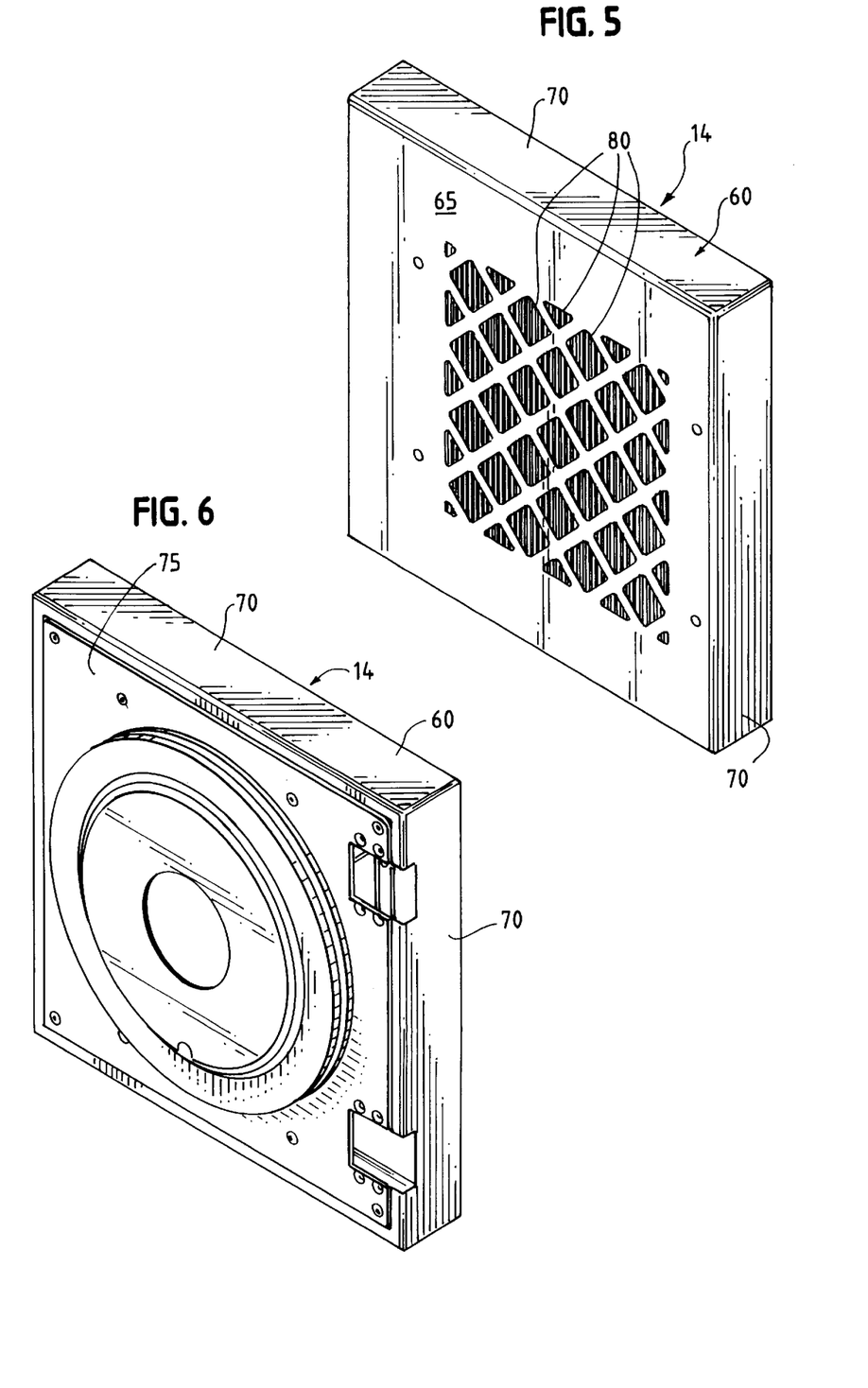
FIGS. 5 and 6 are front and rear perspective views, respectively, of an assembled door having the gas intake arrangement constructed in accordance with one embodiment of the present invention.
Figure 7A:
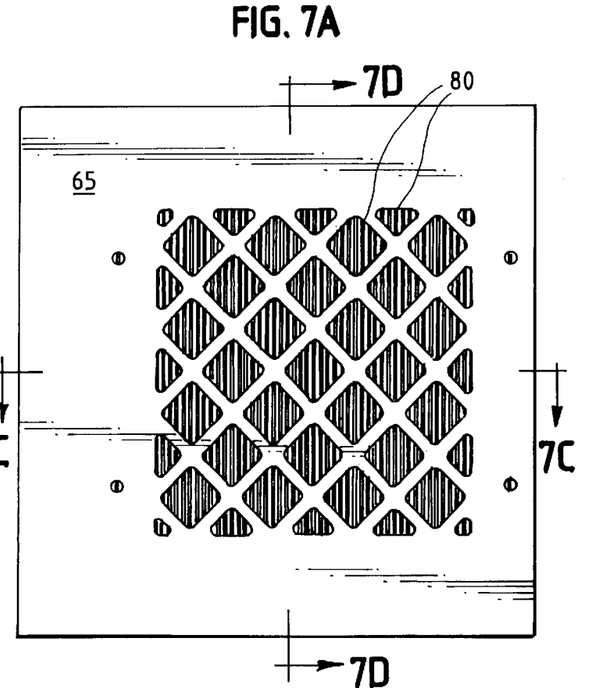
FIGS. 7A–7D are various views, including cross-sectional views, of a door assembled using the components shown in FIG. 4.
Figure 7B:
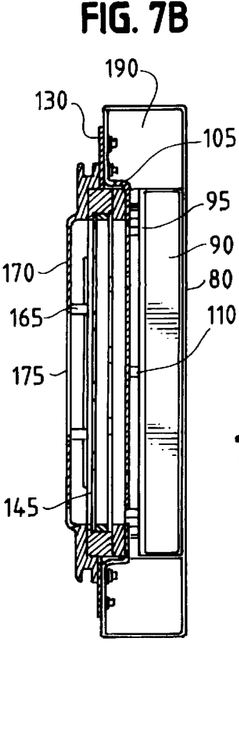
Figure 7C:
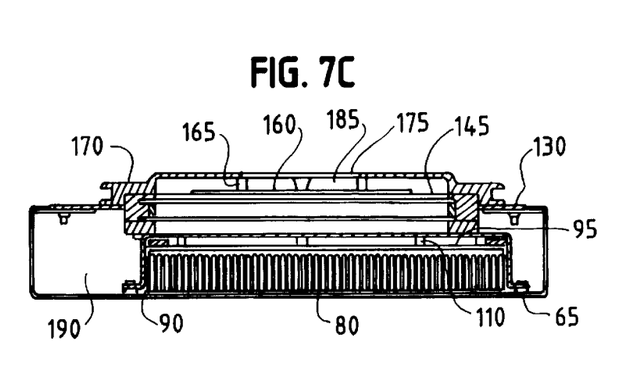
Figure 7D:
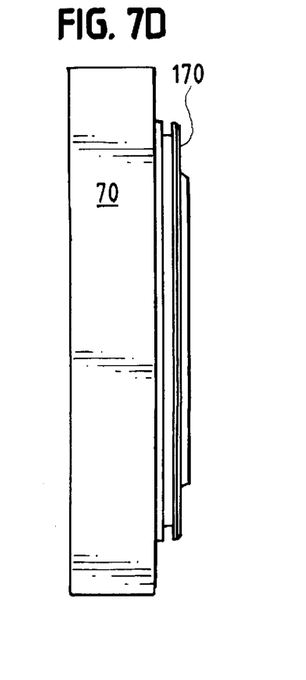

FIG. 3 shows the principal operational components of the upper section 30 of the apparatus 10 with various cabinet panels removed. As shown, the carrier rotor 15 is either directly or indirectly coupled to an electrically driven motor assembly 21. The motor assembly 21 provides a controlled rotational driving of carrier rotor 15 within bowl 12. Although the specific implementation of the motor assembly 21 is not particularly pertinent to the present invention, a preferred motor assembly 21 is illustrated in U.S. Ser. No. 08/897,914, titled Motor Drive Assembly for Semiconductor Wafer Processing System, (Attorney Docket No. 11818US01) and filed on even date herewith.

Figure 2:
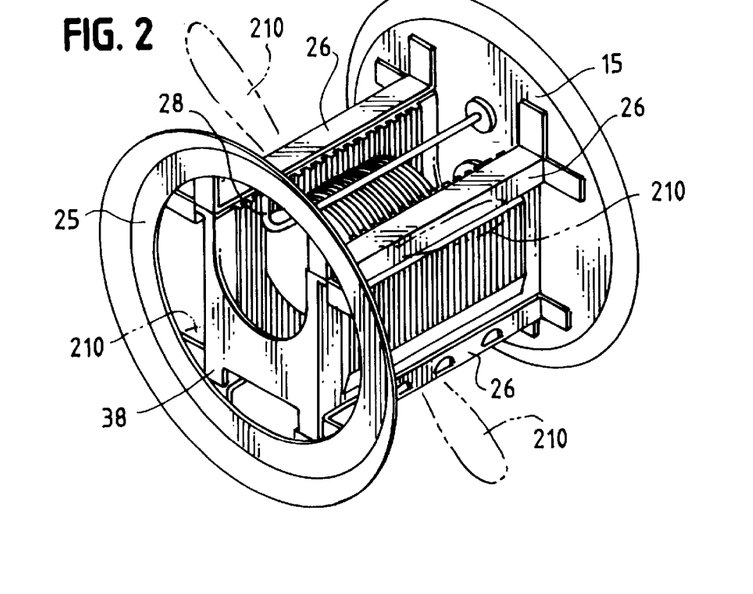
FIG. 2 is a perspective view of one embodiment of a wafer support structure that may be used in the apparatus of FIG. 1.

Bowl 12 is stationary and is connected to frame 50 which is preferably vibrationally supported by shock absorbers 17 (FIG. 1. The bowl 12 is provided with a plurality of spray members 33 that are disposed above and parallel to support members 26 of carrier rotor 15 to direct processing fluids toward wafers supported in the processing chamber by the carrier 38. Support member 26 and support rod 28 are coupled to support ring 25 as shown in FIG. 2, providing the outer support for carrier 38.

In prior processing apparatus of the foregoing kind, one or more of the plurality of spray members 33 are dedicated to providing heated nitrogen to the processing chamber during predetermined portions of the wafer processing cycle, e.g., during a drying cycle following, for example, rinsing of a wafer with de-ionized water. In contrast to prior apparatus, the present system utilizes an ambient gas intake system disposed in the door 14. The gas intake system provides a flow of filtered, heated ambient gas to the processing chamber and can be used in lieu of, or in addition to the heated nitrogen supply.

FIGS. 4, 5, and 7A–7D illustrate one embodiment of the door 14 including the ambient gas intake system. As shown, the door 14 includes a shell, shown generally at 60, having a front wall 65, a plurality of sidewalls 70, and a rear wall 75. The walls of the shell 60 are in the shape of a rectangular box, although other shapes may be used depending on system requirements. Together, the walls define an enclosure including various components used contain to heat and filter an ambient gas flow to the processing chamber.

Front wall 65 includes a plurality of openings 80 that are of sufficient size and number to permit a free flow of ambient gas into the gas intake system of the door 14. In the illustrated embodiment, the plurality of openings 80 are arranged in a substantially rectangular shape and correspond to the shape of the gas flow region 85 of a high efficiency filter 90. The high efficiency filter 90 is disposed immediately adjacent the plurality of openings 80.

The high efficiency filter 90 is preferably an ULPA filter having an efficiency of greater than 99.999%. The filter 90 is preferably made from a material that does not react with any of the fluids used in the apparatus 10 to process the semiconductor wafers. An exemplary material suitable for use in such a filtered is disclosed in U.S. Pat. No. 5,507,847, titled "ULPA Filter". Further suitable filters are available from A. L. Gore, Inc.

A first baffle 95 having a plurality of openings 100 that are arranged in a rectangular shape to correspond to the gas flow region 85 of the high efficiency filter 90 is disposed interior to and immediately adjacent the high efficiency filter 90. A second baffle 105 is disposed in spaced relation to the first baffle 95 by a plurality of spacing/mounting members 110. The second baffle 105 includes a plurality of openings 115 that are arranged in a generally circular pattern and forward extending mounting members 120 for securement with the front wall 65 of the shell 60.

The second baffle 105 also includes rearward extending mounting members 125 that are used for securement with a heating assembly 130. The heating assembly 130 is comprised of a base plate 135 having a central circular aperture 140 disposed therein that is dimensioned to accept a heater 145 for mounting therein. Heater 145 includes a generally circular gas flow area 0.50 through which ambient gas is heated as it passes therethrough. The generally circular arrangement of the plurality of openings 115 in the second baffle 105 substantially conforms in shape and size to the generally circular gas flow area 150 of the heater 145.

The heater 145 is preferably is formed with heating foils that are sandwiched between quartz plates. Such a heater is available from Watlow Electric Manufacturing Company of St. Louis, Mo.

A third, generally solid, circular baffle 160 is disposed interior to the heater 145 at the heated gas exit of the heater. The third baffle 160 has a diameter that is smaller than the diameter of the gas flow area 150 of the heater 145. A plurality of mounting spacers 165 extend rearward from the third baffle 160 to engage and mount the third baffle 160 to a door ring 170 that, in turn, is mounted to the base plate 135. In the disclosed embodiment, the door ring 170 and the base plate 135 form the rear wall 75 of the shell 60.

The door ring 170 is generally circular in shape and is dimensioned to engage and seal with the opening 13 of the bowl 12. Accordingly, the circumferential edge of the door ring 170 may include gasket seals, sealing lips, and/or other structures that ensure a proper seal with the edges of opening 13. The door ring 170 also includes a generally circular aperture 175 disposed therethrough. The circular aperture 175 opens to the processing chamber of the bowl 12 when the door 14 is in a closed position, and preferably has a diameter that is smaller than the diameter of the third baffle 160. The third baffle 160 thus effectively operates as a heat shield that prevents direct irradiation of the contents of the processing chamber by the heater 145. Further, the third baffle 160 functions as a splash guard to protect heater 145 from being directly spray/splashed with processing fluid.

When assembled, the sidewalls 180 of high efficiency filter 90 engage one or more of sidewalls 70 of the shell 60. The forward extended mounting members 120 of the second baffle 105 are used to secure the second baffle 105 to the front wall 65 of the shell 60 thereby urging the first baffle 95 directly against the rearward side of the high efficiency filter 90 and clamping the filter between the first baffle 95 and front wall 65. The forward side of the heater 145 is disposed immediately adjacent the plurality of openings 115 of the second baffle 105 when the rearward extending mounting members 125 are secured with the base plate 135. The rear portion of the heater 145 is disposed proximate the base plate 135 and spaced from third baffle 160 by virtue of a recessed region 185 in the interior of the shell 60 in which the third baffle 160 is secured to the door ring 170. The circular formations of the plurality of openings 115, flow area 150, third baffle 160, and opening 175 are preferably concentric when the door 14 is assembled. The door 14 may also be provided with a chamber 190 for housing any electronic monitoring component, control wiring, etc. used in connection with the monitor and control of heating, flow, and filtering of the ambient gas passing through the gas intake assembly.

In operation of the apparatus 10, semiconductor wafers in carrier 38 are placed in support members 26 of carrier rotor 15 as shown in FIG. 2. Support rod 28, as shown in FIG. 2, retains the semiconductor wafers in carrier 38 when carrier rotor 15 is revolving at relatively low RPM's. As the speed of rotation of carrier rotor 15 increases, the semiconductor wafers are held in place by centrifugal force. The semiconductor wafers are processed by the application of various fluids through spray members 33. In accordance with a rinsing process, de-ionized water is applied to the wafers as the wafers are rotated on carrier rotor 15. After application of the de-ionized water, the carrier rotor 15 continues to rotate the wafers as filtered and heated gas from the ambient atmosphere is provided through the gas intake assembly of the door 14. The rotational movement of the carrier rotor 15 may be sufficient to draw ambient gas through the gas intake assembly and into the processing chamber. However, further flow enhancing structures may be used as well. For example, the carrier rotor 15 may include airfoils, such as in phantom outline at 210 of FIG. 2, to assist in propelling gas into the processing chamber. Still further, bowl 12 may be coupled to the exhaust 215 of the clean room in which the apparatus 10 is situated (FIG. 1). The negative pressure created in the processing chamber of the bowl 12 by the exhaust 215 would provide a flow of ambient gas through the gas intake assembly of door 14. A valve 220 or the like may be disposed in the exhaust path from the processing chamber to thereby facilitate controlled flow of the ambient gas. A still further alternative for generating the ambient gas flow is to provide a fan or the like as part of the gas intake assembly of the door 14.

Carrier rotor 15 rotates substantially around an axis of rotation that is generally horizontal. It is desirable, however, that this angle of the axis of rotation be greater or lesser than exactly horizontal to prevent the semiconductor wafers from contacting each other during processing. If the semiconductor wafers or masks contact each other during processing, a surface tension may be formed which would prevent processing of the semiconductor wafers or masks in the area of contact resulting in a lower yield. In the preferred embodiment shown here, the angle of the axis of rotation is more or less 10 degrees above horizontal. This adds to the ease of loading of the semiconductor wafers and as a result of the angle, carrier 38 easily slides into support members 26 without the requirement of a retaining device to prohibit carrier 38 from falling out of apparatus 10.

Numerous modifications may be made to the foregoing system without departing from the basic teachings thereof. For example, the sidewalls 70 of the door 14 may be provided with one or more air flow apertures in addition to, or in lieu of those in the front wall. In such instances, the high efficiency filter would also include an air flow path sufficient to filter ambient gas entering through the door sidewalls.

Although the present invention has been described in substantial detail with reference to one or more specific embodiments, those of skill in the art will recognize that changes may be made thereto without departing from the scope and spirit of the invention as set forth in the appended claims.

We claim:

1. An apparatus for processing a wafer, the apparatus comprising:

a processing bowl defining a processing chamber having an opening;

a wafer support structure adapted to support at least one wafer, the wafer support being mounted for rotation within the processing chamber, the opening of the bowl being positioned and of sufficient size to facilitate placement of the at least one wafer in the processing chamber through the opening of the processing bowl;

a motor drive assembly connected to rotate the wafer support structure;

at least one fluid nozzle for accepting processing fluid and spraying the processing fluid on the one or more wafers carried by the wafer support structure;

a door for sealing the opening of the processing bowl, the door having a first opening that is open to atmosphere to facilitate passage of ambient gas into the door and a second opening that is open to the processing chamber to facilitate passage of ambient gas into the processing chamber;

an ambient gas intake assembly disposed in the door between the first and second openings of the door, the ambient gas intake assembly comprising a high efficiency filter disposed to filter ambient gas passing from the opening of the bowl to the processing chamber, a heater disposed to heat the ambient gas prior to entering the processing chamber.

2. An apparatus as claimed in claim 1 wherein the high efficiency filter is an ULPA filter.

3. An apparatus as claimed in claim 1 and further comprising a baffle disposed between the high efficiency filter and the heater.

4. An apparatus as claimed in claim 1 and further comprising a baffle disposed between the heater and the processing chamber.

5. An apparatus as claim in claim 1 and further comprising an exhaust aperture in the processing bowl to facilitate gas flow through the ambient gas intake assembly and into the processing chamber.

6. An apparatus as claimed in claim 1 wherein rotation of the wafer support structure facilitates gas flow from the ambient gas intake assembly through the processing chamber.

7. An apparatus as claimed in claim 6 wherein the wafer support structure includes a gas flow structure to further enhance gas flow through the ambient gas intake assembly and into the processing chamber.

8. In an apparatus for processing a wafer including a processing bowl defining a processing chamber having an opening, a wafer support structure adapted to support at least one wafer for processing, the opening of the bowl being positioned and of sufficient size to facilitate placement of the at least one wafer in the processing chamber through the opening, a door for sealing the opening of the processing bowl, the door comprising:

an ambient gas inlet in the door that is open to atmosphere to facilitate passage of ambient gas into the processing chamber;

a high efficiency filter disposed in the door to filter ambient gas passing from the opening to the processing chamber;

a heater disposed in the door to heat the ambient gas prior to entering the processing chamber;

an ambient gas outlet in the door that is open to the processing chamber to facilitate passage of the heated and filtered ambient gas to the processing chamber.

9. An apparatus as claimed in claim 8 wherein the high efficiency filter is an ULPA filter.

10. An apparatus as claimed in claim 8 and further comprising a baffle disposed between the high efficiency filter and the heater.

11. An apparatus as claimed in claim 8 and further comprising a baffle disposed between the heater and the ambient gas outlet.

12. An apparatus as claimed in claim 8 wherein the high efficiency filter is an ULPA filter.

13. In an apparatus for processing a wafer including a processing bowl defining a processing chamber having an opening, a wafer support structure adapted to support at least one wafer for processing, the opening of the bowl being positioned and of sufficient size to facilitate placement of the at least one wafer in the processing chamber through the opening, a door for sealing the opening of the processing bowl, the door comprising:

a shell having a front wall, sidewalls, and a rear wall defining an enclosure, the front wall including at least one opening that is exposed to ambient gas when the door is in a closed position with respect to the opening of the processing bowl, the rear wall having at least one opening exposed to the processing chamber;

a high efficiency filter disposed proximate the at least one opening of the front wall to filter ambient gas passing from the at least one opening of the front flow to the processing chamber through the at least one opening of the rear wall,     a heater disposed in the shell at a position interior to the high efficiency filter to heat the filtered gas prior to entering the processing chamber through the at least one opening of the rear wall.

14. A door as claimed in claim 13 wherein the high efficiency filter is a ULPA filter.

15. A door as claimed in claim 13 wherein the front wall of the shell comprises a plurality of openings therein.

16. A door as claimed in claim 13 wherein the sidewalls of the shell substantially conform to sidewalls of the high efficiency filter.

17. A door as claimed in claim 13 wherein the heater is generally circular in shape, the door further comprising a baffle disposed between the high efficiency filter and the heater, the baffle having openings arranged in a generally circular shape substantially conforming to the circular shape of the heater.

18. A door as claimed in claim 17 and further comprising a generally circular shaped baffle disposed between the generally circular shaped heater and the at least one opening of the rear wall of the shell, the generally circular shaped baffle being aligned concentrically with the generally circular shaped heater and having a smaller diameter than the generally circular shaped heater.

19. A door as claimed in claim 18 wherein the at least one opening in the rear wall is generally circular in shape and has a diameter that is smaller than the generally circular shaped baffle.

20. In an apparatus for processing a wafer including a processing bowl defining a processing chamber having an opening, a wafer support structure adapted to support at least one wafer for processing, the opening of the bowl being positioned and of sufficient size to facilitate placement of the at least one wafer in the processing chamber through the opening, a door for sealing the opening of the processing bowl, the door comprising:

a shell having a front wall, sidewalls, and a rear wall defining an enclosure, the front wall including a plurality of openings that are exposed to ambient gas when the door is in a closed position with respect to the opening of the processing bowl, the plurality of openings being arranged in a first predetermined shape, the rear wall having at least one opening exposed to the processing chamber, the at least one opening in the rear wall having a second predetermined shape;

a high efficiency filter disposed in the enclosure proximate the plurality of openings of the front wall to filter ambient gas passing from the at least one opening of the front flow to the processing chamber through the at least one opening of the rear wall, the high efficiency filter having sidewalls forming a shape substantially similar to the first predetermined shape, the sidewalls of the enclosure conforming to the sidewalls of the high efficiency filter;

a heater disposed in the enclosure at a position interior to the high efficiency filter to heat the filtered gas prior to its entering the processing chamber through the at least one opening of the rear wall, the heater having a flow area that is substantially the same shape as the second predetermined shape but being larger than the at least one opening of the rear wall;

a first baffle having openings arranged in the same shape as the second predetermined shape and, the shape of the opening arrangement substantially conforming in magnitude with the flow area of the heater, the first baffle being disposed in the enclosure between the front wall of the shell and the heater;

a second baffle having a periphery in the same shape as the second predetermined shape, the shape of the periphery of the second baffle being smaller than the flow area of the heater and larger than the size of the at least one opening of the rear wall.

21. A door as claimed in claim 20 wherein the first predetermined shaped is generally rectangular.

22. A door as claimed in claim 20 wherein the second predetermined shape is generally circular.

23. A door as claimed in claim 21 wherein the second predetermined shape is generally circular.

24. An apparatus for processing a wafer, the apparatus comprising:

a processing bowl defining a processing chamber having an opening;

a wafer support structure adapted to support at least one wafer, the     wafer support being mounted for rotation within the processing chamber, the opening of the bowl being positioned and of sufficient size to facilitate placement of the at least one wafer in the processing chamber through the opening of the processing bowl;

a motor drive assembly connected to rotate the wafer support structure;

at least one fluid nozzle for accepting processing fluid and spraying the processing fluid on the one or more wafers carried by the wafer support structure;

a door for sealing the opening of the processing bowl, the door having a first opening that is open to atmosphere to facilitate passage of ambient gas into the door and a second opening that is open to the processing chamber to facilitate passage of ambient gas into the processing chamber;

an ambient gas intake assembly disposed in the door between the first and second openings of the door, the ambient gas intake assembly comprising a high efficiency filter disposed to filter ambient gas passing from the opening of the bowl to the processing chamber.

25. An apparatus as claimed in claim 24 wherein the high efficiency filter is an ULPA filter.

26. In an apparatus for processing a wafer including a processing bowl defining a processing chamber having an opening, a wafer support structure adapted to support at least one wafer for processing, the opening of the bowl being positioned and of sufficient size to facilitate placement of the at least one wafer in the processing chamber through the opening, a door for sealing the opening of the processing bowl, the door comprising:

- an ambient gas inlet in the door that is open to atmosphere to facilitate passage of ambient gas into the processing chamber;
- a high efficiency filter disposed in the door to filter ambient gas passing from the opening to the processing chamber;
- an ambient gas outlet in the door that is open to the processing chamber to facilitate passage of the heated and filtered ambient gas to the processing chamber.

27. In an apparatus for processing a wafer including a processing bowl defining a processing chamber having an opening, a wafer support structure adapted to support at least one wafer for processing, the opening of the bowl being positioned and of sufficient size to facilitate placement of the at least one wafer in the processing chamber through the opening, a door for sealing the opening of the processing bowl, the door comprising:

- a shell having a front wall, sidewalls, and a rear wall defining an enclosure, the front wall including at least one opening that is exposed to ambient gas when the door is in a closed position with respect to the opening of the processing bowl, the rear wall having at least one opening exposed to the processing chamber;
- a high efficiency filter disposed proximate the at least one opening of the front wall to filter ambient gas passing from the at least one opening of the front flow to the processing chamber through the at least one opening of the rear wall.

28. A door as claimed in claim 27 wherein the high efficiency filter is a ULPA filter.

* * * * *